(12) United States Patent
Chen

(10) Patent No.: US 7,671,716 B2
(45) Date of Patent: Mar. 2, 2010

(54) INDUCTIVE MODULE

(75) Inventor: Aaron Chen, Taiwan (TW)

(73) Assignee: Taimag Corporation, Kaohsiung (TW)

( * ) Notice: Subject to any disclaimer, the term of this patent is extended or adjusted under 35 U.S.C. 154(b) by 24 days.

(21) Appl. No.: 12/236,161

(22) Filed: Sep. 23, 2008

(65) Prior Publication Data

US 2009/0273428 A1 Nov. 5, 2009

(30) Foreign Application Priority Data

May 1, 2008 (TW) ................ 97116077 A

(51) Int. Cl.
*H01F 5/00* (2006.01)
(52) U.S. Cl. .................................. 336/200
(58) Field of Classification Search ............ 336/65, 336/200, 225, 229, 232; 361/760–764
See application file for complete search history.

(56) References Cited

U.S. PATENT DOCUMENTS 6,148,500 A * 11/2000 Krone et al. ............. 29/602.1
7,253,711 B2   8/2007 Pleskach et al.
7,602,272 B2 * 10/2009 Whittaker et al. ......... 336/200

\* cited by examiner

*Primary Examiner*—Tuyen Nguyen
(74) *Attorney, Agent, or Firm*—Black Lowe & Graham, PLLC

(57) ABSTRACT

An inductive module includes an electrically insulating basic substrate unit having opposite first and second trace-forming sides, a ferromagnetic core unit embedded in the basic substrate unit and having horizontal sides substantially parallel to and respectively spaced apart from the first and second trace-forming sides, and a coil unit. The coil unit includes first and second conductive vias respectively formed in the basic substrate unit adjacent to vertical sides of the core unit, and respectively spaced apart from the vertical sides, and first and second conductive traces, each of which is disposed on a corresponding one of the first and second trace-forming sides, and interconnects electrically a corresponding pair of the first and second conductive vias. The conductive traces and the conductive vias of the coil unit cooperate to form an electric current path that substantially winds around the core unit.

22 Claims, 16 Drawing Sheets

INDUCTIVE MODULE

BACKGROUND OF THE INVENTION

1. Field of the Invention

The invention relates to an inductive device, more particularly to an inductive module.

2. Description of the Related Art

A conventional inductive device, such as an inductor, a transformer, etc., is composed of one or more windings wound around a core that is made from a ferromagnetic material. Electromagnetic effects occur between the winding and the core when electric current flows through the winding. For producing larger transformers, a specialized coil winding machine is used for winding the windings onto the core, where production of the transformers is relatively automated. However, for smaller transformers, especially pulse transformers for use in the field of digital communication, to wind the windings, usually in the form of enamel-covered wires, on relatively small annular cores, and to place the winding-wounded core into a housing for subsequent packaging are steps that still require manual labor. Such manual operations have the following shortcomings:

1. Time-Consuming/Low Production Rate:

Due to the small size of the core, the enamel-covered wires need to be precisely wound around the core by operating personnel in a production line. However, the manufacturing process is time-consuming and costly in view of high labor expenses. in addition, since automation of the manufacturing process is not possible, low productivity results.

2. Low Yield:

Since pulse transformers of different standards require different numbers of windings, operating personnel must be aware of the number of windings required for the particular product currently being manufactured. Quality and accuracy of the products produced by a manufacturing process relying so highly on human operation are easily affected by human errors, thereby increasing deviations of the actual product from ideal specifications. Furthermore, enamel-covered wires are easily damaged during the winding and packaging operations.

In view of the above shortcomings, improvements are required in the overall structure, the manufacturing process, and productivity of relatively small inductive devices.

U.S. Pat. No. 7,253,711 discloses a method for making an embedded toroidal inductor that includes forming in a ceramic substrate conductive vias and conductive traces that define a three dimensional toroidal coil. The inductor disclosed in the patent has a ceramic core rather than a ferromagnetic core. In addition, the method requires the incorporation of low temperature co-fired ceramic (LTCC) technology, which is normally carried out under a temperature of between 900 to 1000 degrees Celsius, and which is relatively costly.

SUMMARY OF THE INVENTION

Therefore, the object of the present invention is to provide an inductive module that improves upon the aforesaid shortcomings of the prior art.

According to one aspect of the present invention, there is provided an inductive module that includes an electrically insulating basic substrate unit, a core unit, and a coil unit.

The basic substrate unit has opposite first and second trace-forming sides.

The core unit is made from a ferromagnetic material, is embedded in the basic substrate unit, and has a pair of opposite first and second vertical sides and a pair of first and second opposite horizontal sides. The first and second horizontal sides are substantially parallel to the first and second trace-forming sides, and are respectively spaced apart from the first and second trace-forming sides.

The coil unit includes a plurality of first conductive vias, a plurality of second conductive vias, a plurality of first conductive traces, and a plurality of second conductive traces. The first conductive vias are formed in the basic substrate unit adjacent to the first vertical side of the core unit, are spaced apart from each other and from the first vertical side of the core unit, and extend from the first trace-forming side to the second trace-forming side. The second conductive vias are formed in the basic substrate unit adjacent to the second vertical side of the core unit, are spaced apart from each other and from the second vertical side of the core unit, and extend from the first trace-forming side to the second trace-forming side. Each of the first conductive traces is disposed on the first trace-forming side of the basic substrate unit, and interconnects electrically a corresponding pair of the first and second conductive vias. Each of the second conductive traces is disposed on the second trace-forming side of the basic substrate unit, and interconnects electrically a corresponding pair of the first and second conductive vias. The first and second conductive traces and the first and second conductive vias of the coil unit cooperate to form an electric current path that substantially winds around the core unit.

According to another aspect of the present invention, there is provided a method for fabricating an inductive module that includes the steps of:

providing an electrically insulating plate body that has opposite first and second sides;

forming an open-ended core-receiving space through the electrically insulating plate body, the core-receiving space having opposite openings respectively disposed at the first and second sides;

disposing an electrically insulating film on one of the first and second sides of the insulating plate body so as to cover the opening of the core-receiving space at said one of the first and second sides;

disposing a ferromagnetic core in the core-receiving space;

injecting an electrically insulating material in the core-receiving space for filling the core-receiving space;

disposing another electrically insulating film on the other one of the first and second sides of the insulating plate body so as to cover the opening of the core-receiving space at the other one of the first and second sides;

disposing a metal foil on each of the electrically insulating films;

forming conductive vias through the insulating plate body, the electrically insulating films, and the metal foils; and removing undesired portions of the metal foils so as to form conductive traces on the electrically insulating films, each of the conductive traces being connected electrically to a corresponding pair of the conductive vias;

wherein the conductive vias and the conductive traces cooperate to form an electric current path that substantially winds around the ferromagnetic core.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
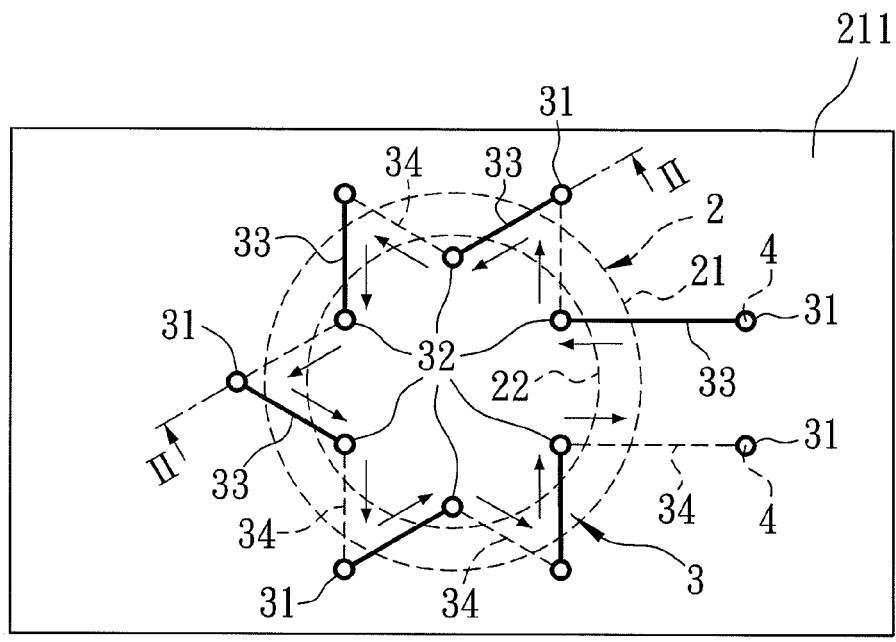
FIG. 1 is a top view of the first preferred embodiment of an inductive module according to the present invention.

Before the present invention is described in greater detail, it should be noted that like elements are denoted by the same reference numerals throughout the disclosure.

Figure 2:
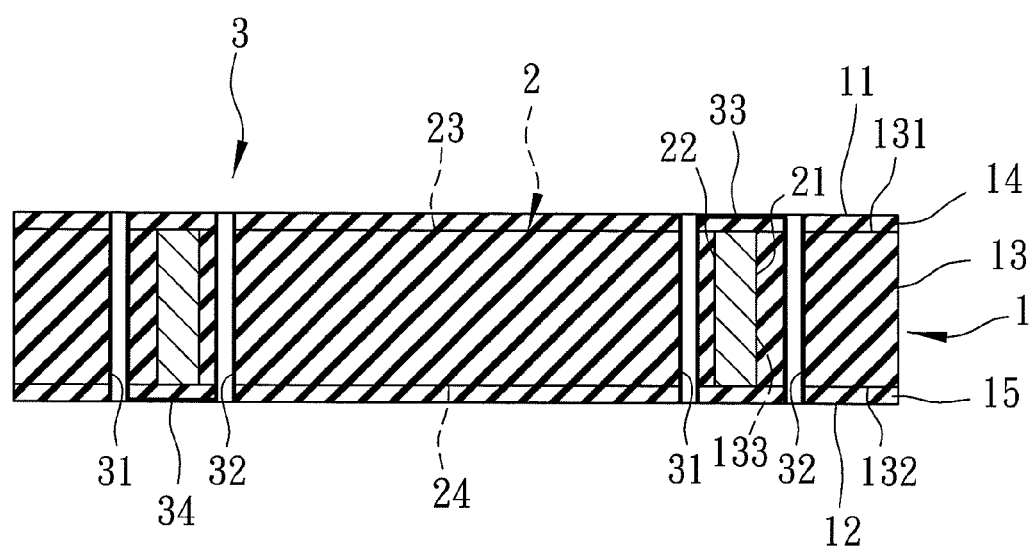
FIG. 2 is across-sectional view of the first preferred embodiment taken along line II-II in FIG. 1.

Referring to FIG. 1 and FIG. 2, the first preferred embodiment of an inductive module according to the present invention is embodied in an inductor, and includes an electrically insolating basic substrate unit 1, a first core unit 2, a first coil unit 3, and a plurality of conductive contacts 4.

The basic substrate unit 1 has opposite first and second trace-forming sides 11, 12.

The first core unit 2 is made from a ferromagnetic material, such as cobalt (Co), iron (Fe), nickel (Ni) etc. The first core unit 2 is embedded in the basic substrate unit 1, and has a pair of opposite first and second vertical sides 21, 22 and a pair of opposite first and second horizontal sides 23, 24. The first and second horizontal sides 23, 24 are substantially parallel to the first and second trace-forming sides 11, 12 of the basic substrate unit 1, and are respectively spaced apart from the first and second trace-forming sides 11, 12.

In this embodiment, the first core unit 2 includes a substantially annular core, and the first and second vertical sides 21, 22 are outer and inner sides of the substantially annular core, respectively.

The first coil unit 3 includes a plurality of first conductive vias 31, a plurality of second conductive vias 32, a plurality of first conductive traces 33, and a plurality of second conductive traces 34. The first conductive vias 31 are formed in the basic substrate unit 1 adjacent to the first vertical side 21 of the first core unit 2, are spaced apart from each other and from the first vertical side 21 of the first core unit 2, and extend from the first trace-forming side 11 to the second trace-forming side 12 of the basic substrate unit 1. The second conductive vias 32 are formed in the basic substrate unit 1 adjacent to the second vertical side 22 of the first core unit 2, are spaced apart from each other and from the second vertical side 22 of the first core unit 2, and extend from the first trace-forming side 11 to the second trace-forming side 12 of the basic substrate unit 1. Each of the first conductive traces 33 is disposed on the first trace-forming side 11 of the basic substrate unit 1, and interconnects electrically a corresponding pair of the first and second conductive vias 31, 32. Each of the second conductive traces 34 is disposed on the second trace-forming side 12 of the basic substrate unit 1, and interconnects electrically a corresponding pair of the first and second conductive vias 31, 32. The first and second conductive traces 33, 34 and the first and second conductive vias 31, 32 of the first coil unit 3 cooperate to form a first electric current path that substantially winds around the first core unit 2. The first electric current path is illustrated by the arrows (A) shown in FIG. 1. Consequently, the inductive module of the first preferred embodiment is a toroidal inductor.

Each of the conductive contacts 4 is in the form of a pin that is secured in a corresponding one of the first and second conductive vias 31, 32, and that is disposed in electrical contact with the corresponding one of the first and second conductive vias 31, 32. The contacts 4 serve as electrical connections to external devices. Since the technical means for securing the pins 4 in the corresponding ones of the first and second conductive vias 31, 32 are readily appreciated by those skilled in the art, further details of the same are omitted herein for the sake of brevity.

In this embodiment, the basic substrate unit 1 includes a central layer 13, and first and second layers 14, 15. The central layer 13 has opposite first and second surfaces 131, 132, and is formed with an open-ended core-receiving space 133 that has openings respectively disposed at the first and second surfaces 131, 132. The first core unit 2 is received in the core-receiving space 133 such that the first and second horizontal sides 23, 24 of the first core unit 2 are exposed respectively from the openings. The first and second layers 14, 15 are disposed respectively on the first and second surfaces 131, 132 of the central layer 13 for covering openings of the core-receiving space 133 and the first and second horizontal sides 23, 24 of the first core unit 2, and are respectively formed with the first and second trace-forming sides 11, 12.

In this embodiment, the basic substrate unit 1 is a printed circuit board that is made from resin and glass fiber-containing fabric. However, the basic substrate unit 1 may be made from other materials suitable for use in a printed circuit board (PCB), and therefore should not be limited to the exemplary materials of this embodiment. The first and second conductive traces 33, 34 of the first coil unit 3 are formed from copper foils respectively plated on the first and second trace-forming sides 11, 12 of the basic substrate unit 1.

A method for fabricating the inductive module according to the first preferred embodiment of the present invention includes the following steps.

First, an electrically insulating plate body that has opposite first and second sides is provided. The insulating plate body forms a basic part of the central layer 13, and is denoted hereinafter by the reference number '13' for simplicity of illustration. The first and second sides respectively form basic portions of the first and second surfaces 131, 132 of the central layer 13, and are denoted hereinafter by the reference numbers '131' and '132' for simplicity of illustration.

Second, an open-ended core-receiving space 133 is formed through the electrically insulating plate body 13. The core-receiving space 133 has opposite openings respectively disposed at the first and second sides 131, 132.

Third, an electrically insulating film (i.e., the second layer 15) is disposed on the second side 132 of the insulating plate body 13 so as to cover the opening of the core-receiving space 133 at the second side 132.

Fourth, a ferromagnetic core 2 is disposed in the core-receiving space 133.

Fifth, an electrically insulating material is injected in the core-receiving space 133 for filling the core-receiving space 133 unoccupied by the core 2. The electrically insulating plate body and the electrically insulating material cooperate to complete the central layer 13.

Sixth, another electrically insulating film (i.e., the first layer 14) is disposed on the first side 131 of the insulating plate body 13 so as to cover the opening of the core-receiving space 133 at the first side 131.

Seventh, a metal foil is disposed on each of the electrically insulating films (i.e., the first and second layers 14, 15).

Eighth, conductive vias 31, 32 are formed through the central layer 13, the electrically insulating films 14, 15, and the metal foils.

Ninth, undesired portions of the metal foils are removed so as to form conductive traces 33, 34 on the electrically insulating films 14, 15. Each of the conductive traces 33, 34 is connected electrically to a corresponding pair of the conductive vias 31, 32. The conductive vias 31, 32 and the conductive traces 33, 34 thus formed cooperate to form an electric current path that substantially winds around the ferromagnetic core 2.

In this embodiment, the electrically insulating plate body 13 is made from epoxy, the electrically insulating material is epoxy, each of the electrically insulating films 14, 15 is a glass fiber-containing film, and the metal foil is a copper foil.

It should be noted herein that steps three and six may be interchanged in other embodiments of the present invention without altering the final result. In other words, an electrically insulating film may be disposed on the first side 131 of the insulating plate body 13 prior to placing the ferromagnetic core 2 and injecting the electrically insulating material, and then another electrically insulating film may be disposed on the second side 132 of the insulating plate body 13 according to other embodiments of the present invention.

Figure 3:
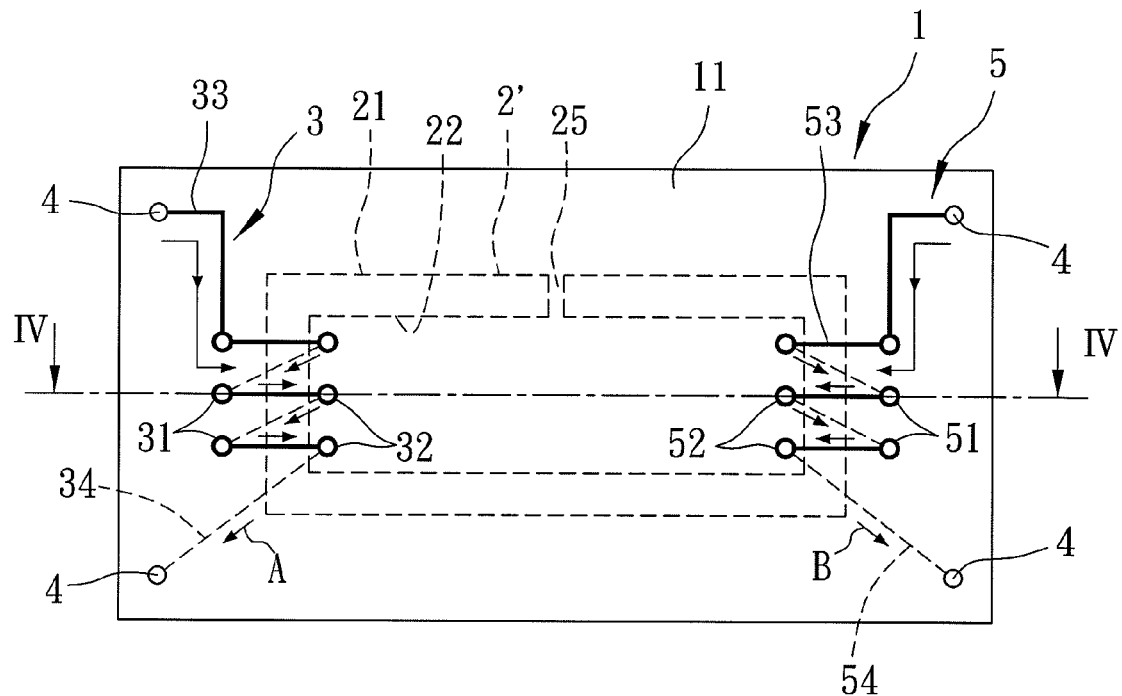
FIG. 3 is a top view of the second preferred embodiment of an inductive module according to the present invention.
Figure 4:
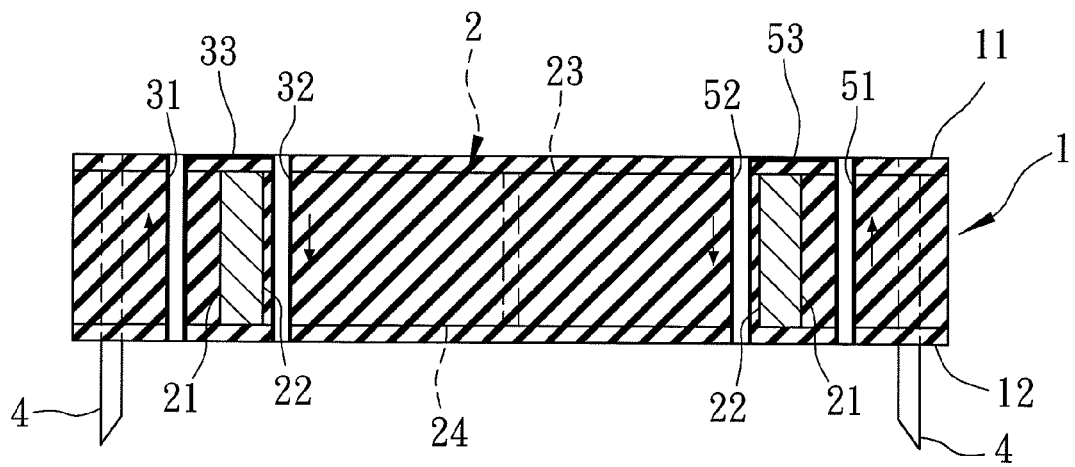
FIG. 4 is a cross-sectional view of the second preferred embodiment taken along line IV-IV in FIG. 3.

As shown in FIG. 3 and FIG. 4, the second preferred embodiment of an inductive module according to the present invention differs from the first preferred embodiment in that the inductive module is embodied in a transformer. In the second preferred embodiment, the first core unit 2' includes a substantially rectangular core that is formed with a gap 25, and the inductive module further includes a second coil unit 5 identical in structure to the first coil unit 1, and spaced apart from the first coil unit 1.

The first and second conductive traces 51, 52 and the first and second conductive vias 53, 54 of the second coil unit 5 cooperate to form a second electric current path (illustrated by arrows (B) shown in FIG. 3) that substantially winds around the first core unit 3, and that is separate from the first electric current path (illustrated by arrows (A) shown in FIG. 3).

Figure 5:
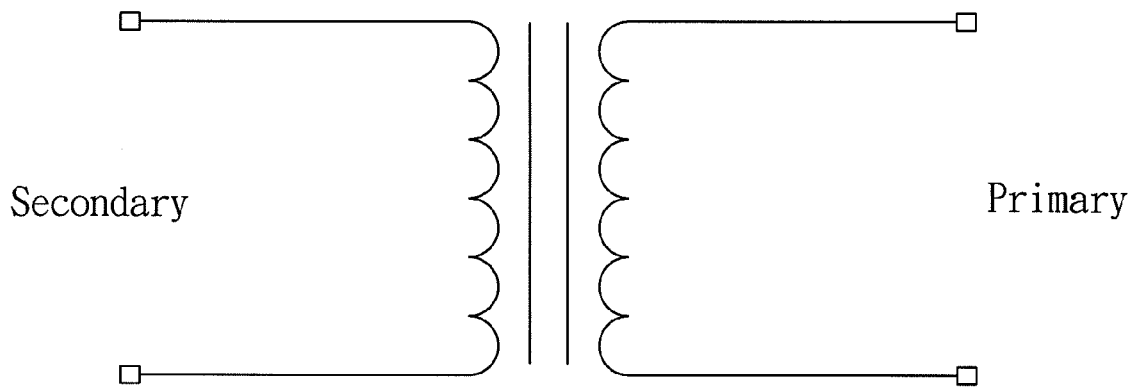
FIG. 5 is a schematic diagram, illustrating a transformer implementation of the second preferred embodiment.

With further reference to FIG. 5, the first and second electric current paths respectively formed by the first and second coil units 3, 5 serve as primary and secondary windings of the transformer, respectively. In this embodiment, the winding ratio between the primary and secondary windings is 1:1 for illustrative purposes. It should be noted herein that the number, configuration, and connections of the first and second conductive vias 31, 32, 51, 52 and the first and second conductive traces 33, 34, 53, 54 of the first and second coil units 3, 5 can be adjusted for achieving the specific winding ratio requirements in other implementations of a transformer according to the present invention.

Figure 6:
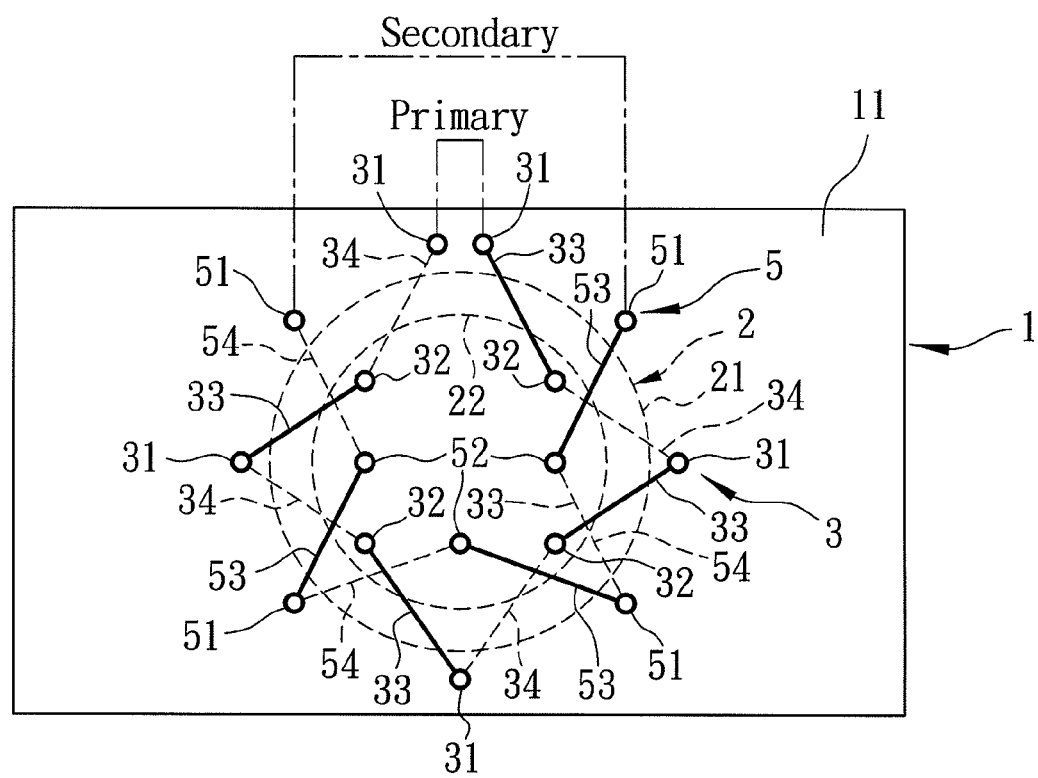
FIG. 6 is a top view of the third preferred embodiment of an inductive module according to the present invention.

As shown in FIG. 6, the third preferred embodiment of an inductive module according to the present invention is also embodied in a transformer. However, the first core unit 2 of the third preferred embodiment, similar to the first preferred embodiment, includes a substantially annular core. In addition, the second electric current path formed cooperatively by the first and second conductive traces 51, 52 and the first and second conductive vias 53, 54 of the second coil unit 5 of the third preferred embodiment is intertwined without crossing the first electric current path.

It should be noted herein that although the inductive module includes only one core unit in the preceding embodiments, two or more core units may be included in other embodiments of the inductive module according to the present invention.

Figure 11:
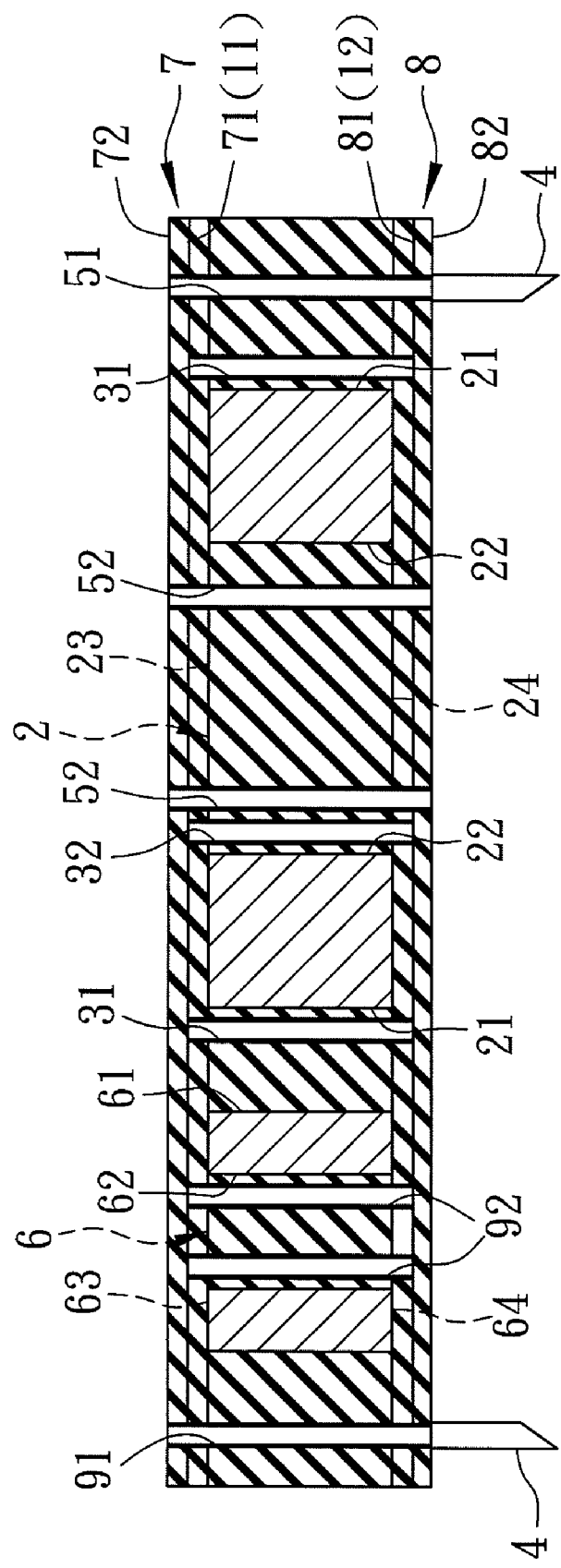
FIG. 11 is a sectional view of the fourth preferred embodiment taken along line XI-XI in FIG. 7.

With reference to FIG. 11, the fourth preferred embodiment of an inductive module according to the present invention mainly differs from the third preferred embodiment in that the fourth preferred embodiment further includes first and second outer substrate units 7, 8. Each of the first and second outer substrate units 7, 8 has an inner side 71, 81 disposed in contact with a corresponding one of the first and second trace-forming sides 11, 12 of the basic substrate unit 1, and an outer trace-forming side 72, 82 opposite to the inner side 71, 81.

Each of the first and second conductive vias 51, 52 of the second coil unit 5 extends not only through the basic substrate unit 1, but further through each of the first and second outer substrate units 7, 8.

Figure 7:
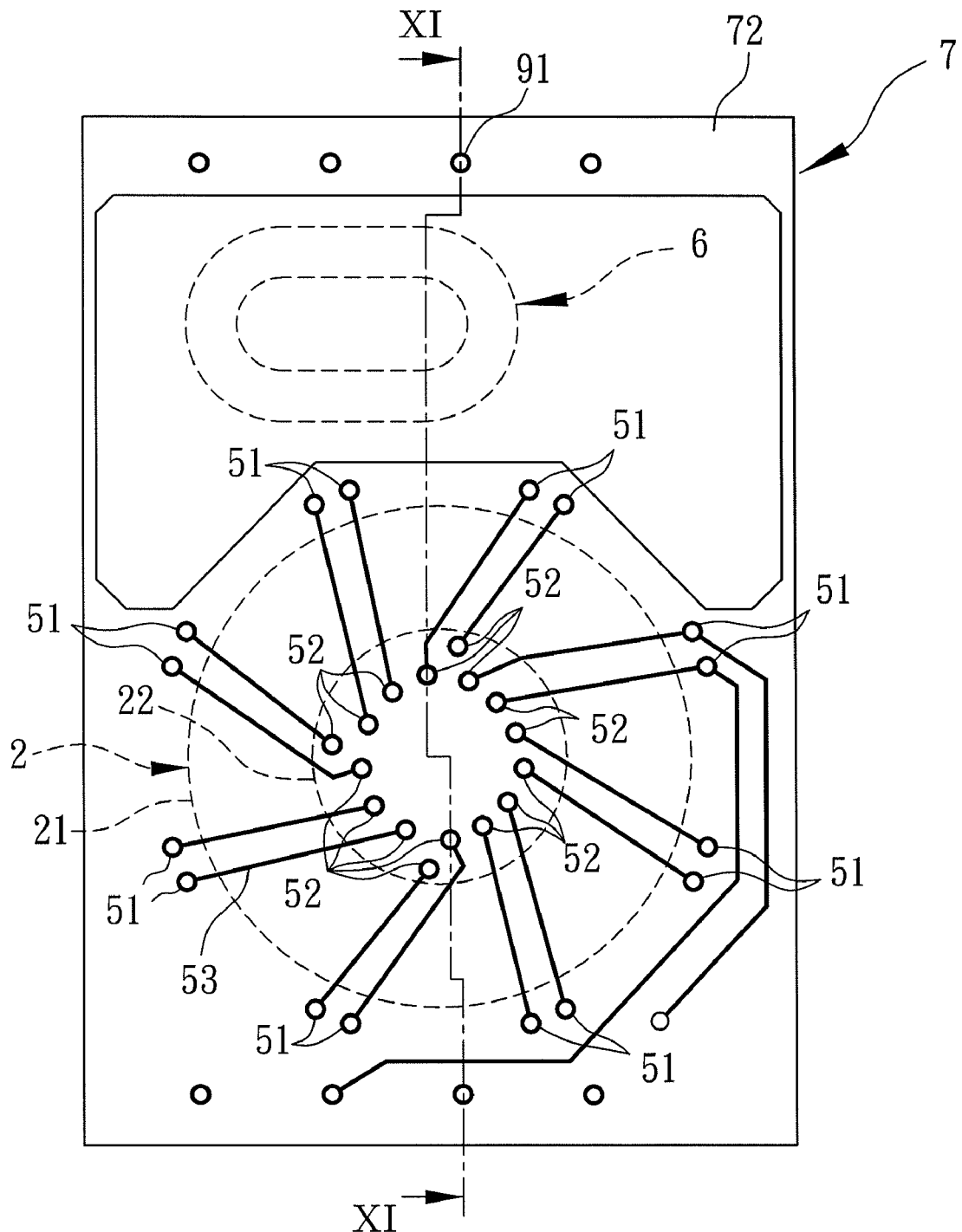
FIG. 7 is a top view of the fourth preferred embodiment of an inductive module according to the present invention, illustrating an outer trace-forming side of a first outer substrate unit.
Figure 10:
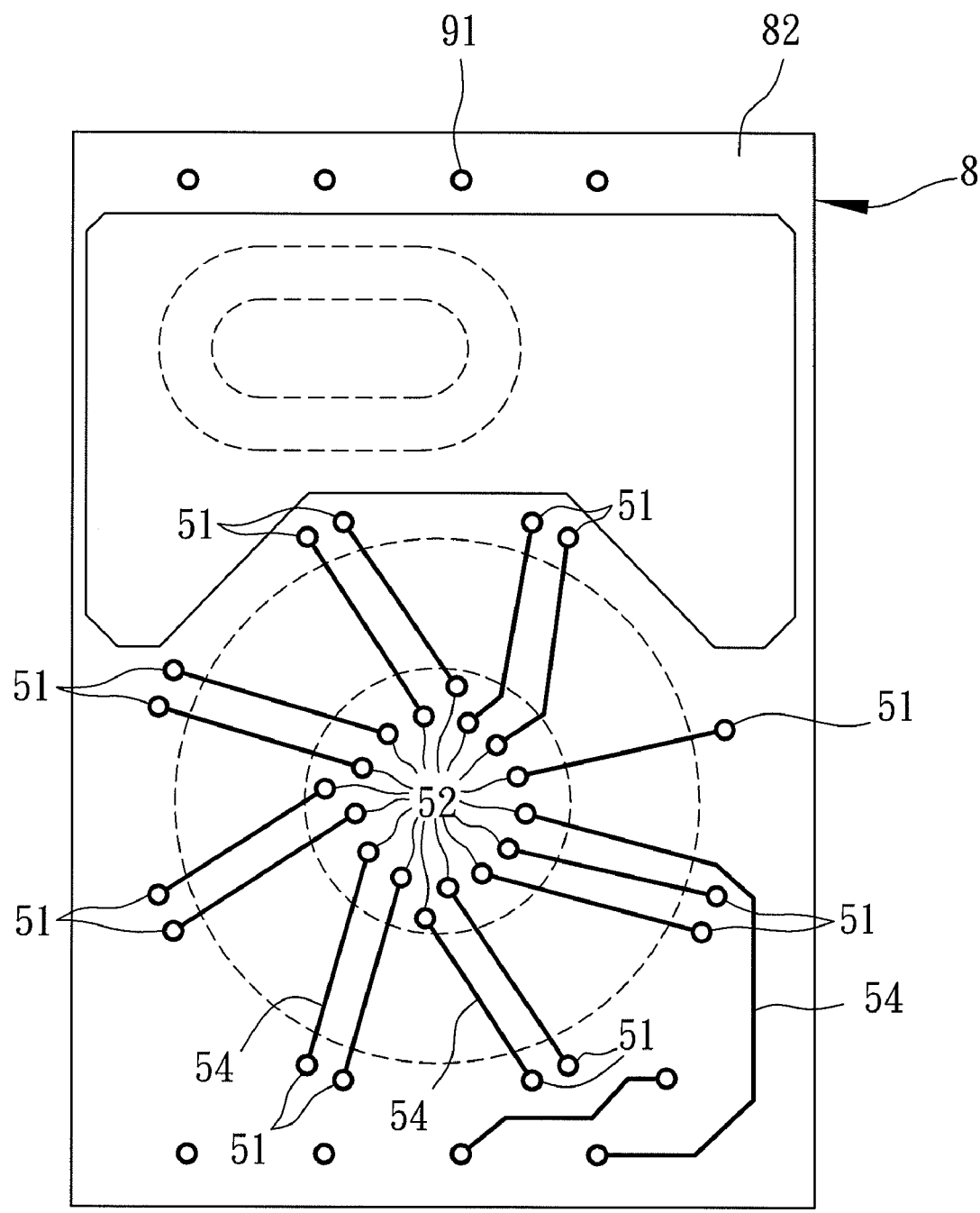
FIG. 10 is a bottom view showing an outer trace-forming side of a second outer substrate unit of the fourth preferred embodiment.

As shown in FIG. 7, different from the third preferred embodiment, the first conductive traces 53 of the second coil unit 5 are disposed on the outer trace-forming side 72 of the first outer substrate unit 7. As shown in FIG. 10, the second conductive traces 54 of the second coil unit 5 are disposed on the outer trace-forming side 82 of the second outer substrate unit 8.

With reference to FIGS. 7 to 10, consequently, the second electric current path formed by the first and second conductive vias 51, 52 and the first and second conductive traces 53, 54 of the second coil unit 5 of the fourth preferred embodiment substantially winds around both the first core unit 2 and the first electric current path formed by the first and second conductive vias 31, 32 and the first and second conductive traces 33, 34 of the first coil unit 3, and is electrically insulated from the first electric current path.

Moreover, in this embodiment, at least one of the second conductive vias 52 of the second coil unit 5 is disposed adjacent to one side of a corresponding one of the second conductive vias 32 of the first coil unit 3 opposite to the second vertical side 22 of the first core unit 2.

The fourth preferred embodiment further differs from the third preferred embodiment in that the fourth preferred embodiment further includes a second core unit 6 and a third coil unit 9. The second core unit 6 is identical in structure to the first core unit 2, is embedded in the basic substrate unit 1, and is spaced apart from the first core unit 2.

Figure 8:
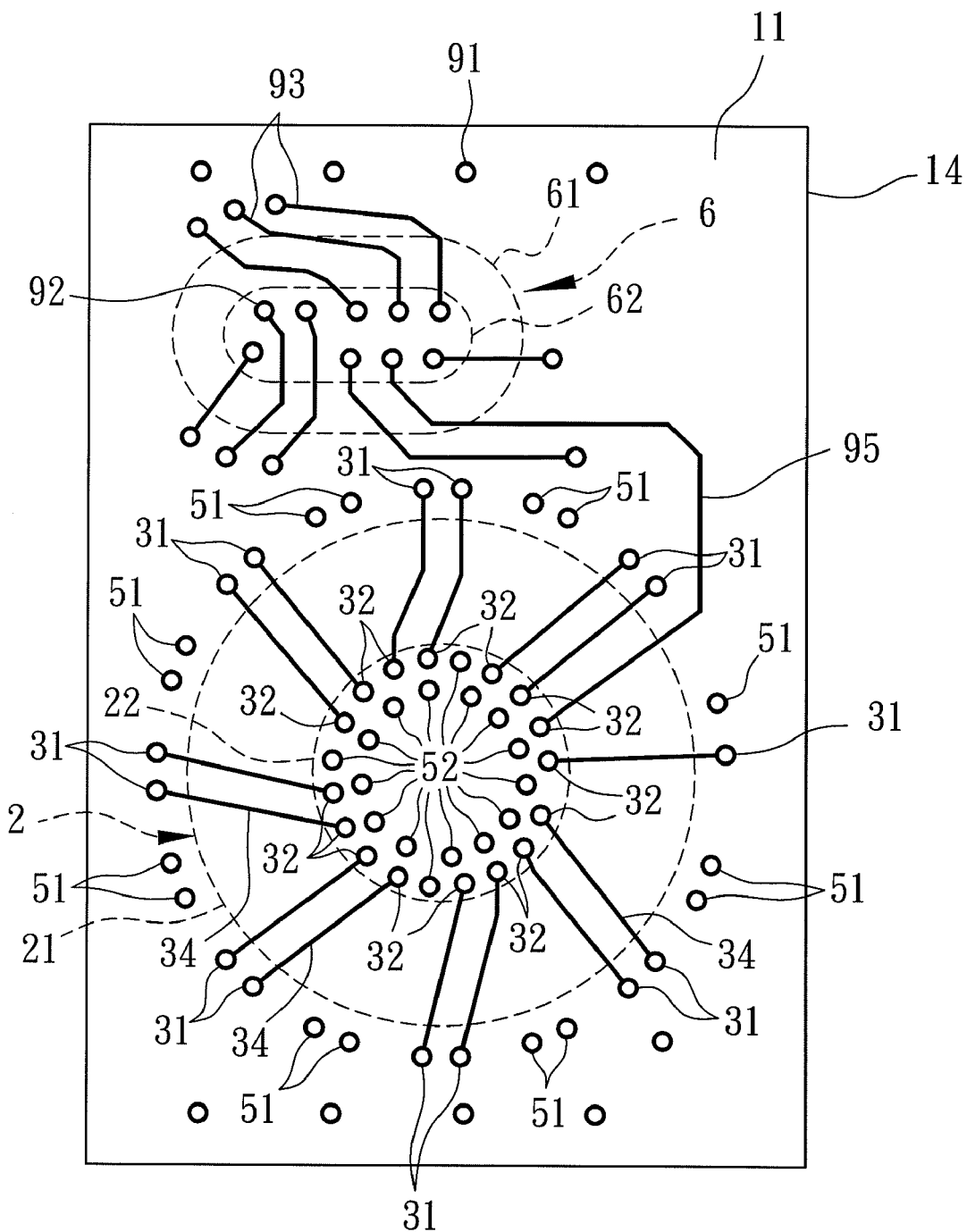
FIG. 8 is a top view showing a first trace-forming side of a basic substrate unit of the fourth preferred embodiment.
Figure 9:
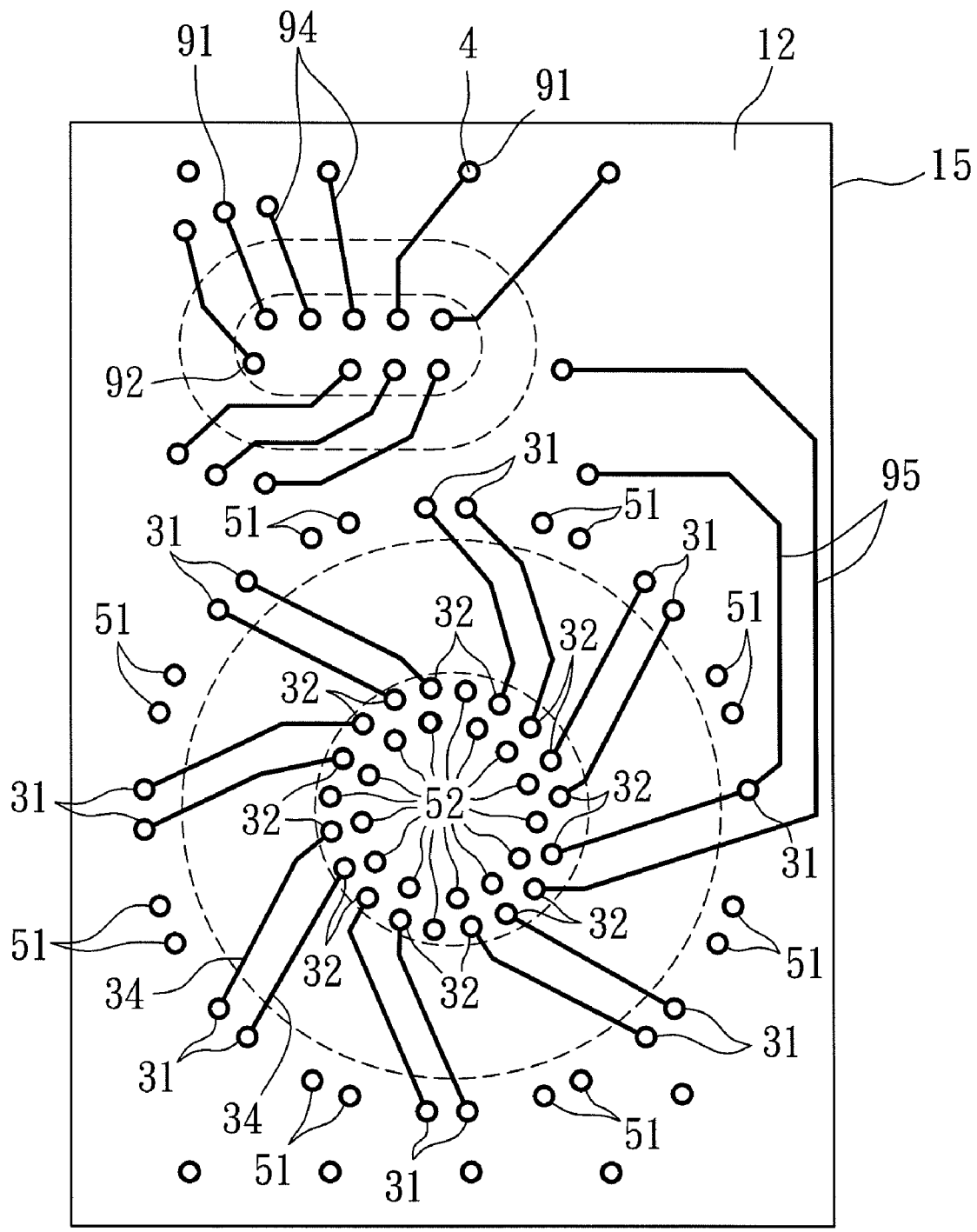
FIG. 9 is a bottom view showing a second trace-forming side of the basic substrate unit of the fourth preferred embodiment.

As shown in FIG. 8 and FIG. 9, the third coil unit 9 includes a plurality of first conductive vias 91, a plurality of second conductive vias 92, a plurality of first conductive traces 93, and a plurality of second conductive traces 94. The first conductive vias 91 are formed in the basic substrate unit 1 adjacent to the first vertical side 61 of the second core unit 6, are spaced apart from each other and from the first vertical side 61 of the second core unit 6, and extend from the first trace-forming side 11 to the second trace-forming side 12 of the basic substrate unit 1. The second conductive vias 92 are formed in the basic substrate unit 1 adjacent to the second vertical side 62 of the second core unit 6, are spaced apart from each other and from the second vertical side 62 of the second core unit 6, and extend from the first trace-forming side 11 to the second trace-forming side 12 of the basic substrate unit 1. Each of the first conductive traces 93 is disposed on the first trace-forming side 11 of the basic substrate unit 1, and interconnects electrically a corresponding pair of the first and second conductive vias 91, 92 of the third coil unit 9. Each of the second conductive traces 94 is disposed on the second trace-forming side 12 of the basic substrate unit 1, and interconnects electrically a corresponding pair of the first and second conductive vias 91, 92 of the third coil unit 9.

The first and second conductive traces 91, 92 and the first and second conductive vias 93, 94 of the third coil unit 9 cooperate to form a third electric current path that substantially winds around the second core unit 6.

Moreover, each of the conductive contacts 4 is secured in a corresponding one of the first conductive vias 51, 91 of a corresponding one of the second and third coil units 5, 9, and is disposed in electrical contact with the corresponding one of the first conductive vias 51, 91 of the corresponding one of the second and third coil units 5, 9.

Figure 12:
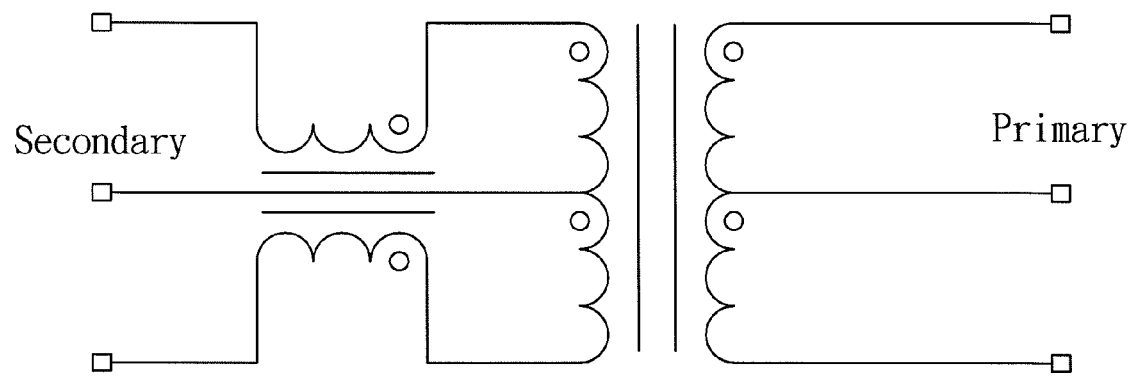
FIG. 12 is a schematic diagram, illustrating a pulse transformer implementation of the fourth preferred embodiment, with center tapped primary and secondary windings and a common-mode choke.
Figure 13:
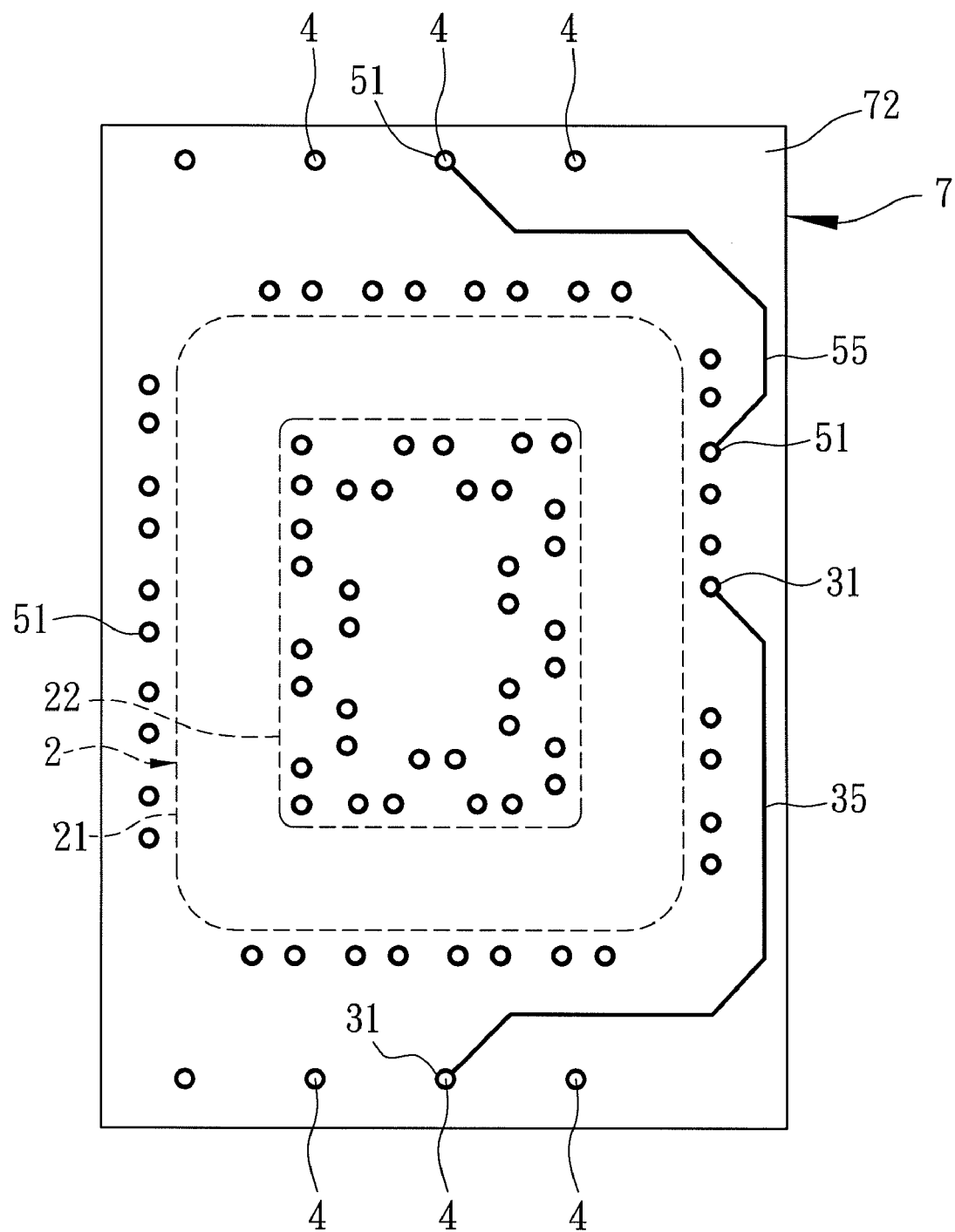
FIG. 13 is a top view of the fifth preferred embodiment of an inductive module according to the present invention, illustrating an outer trace-forming side of a first outer substrate unit.
Figure 14:
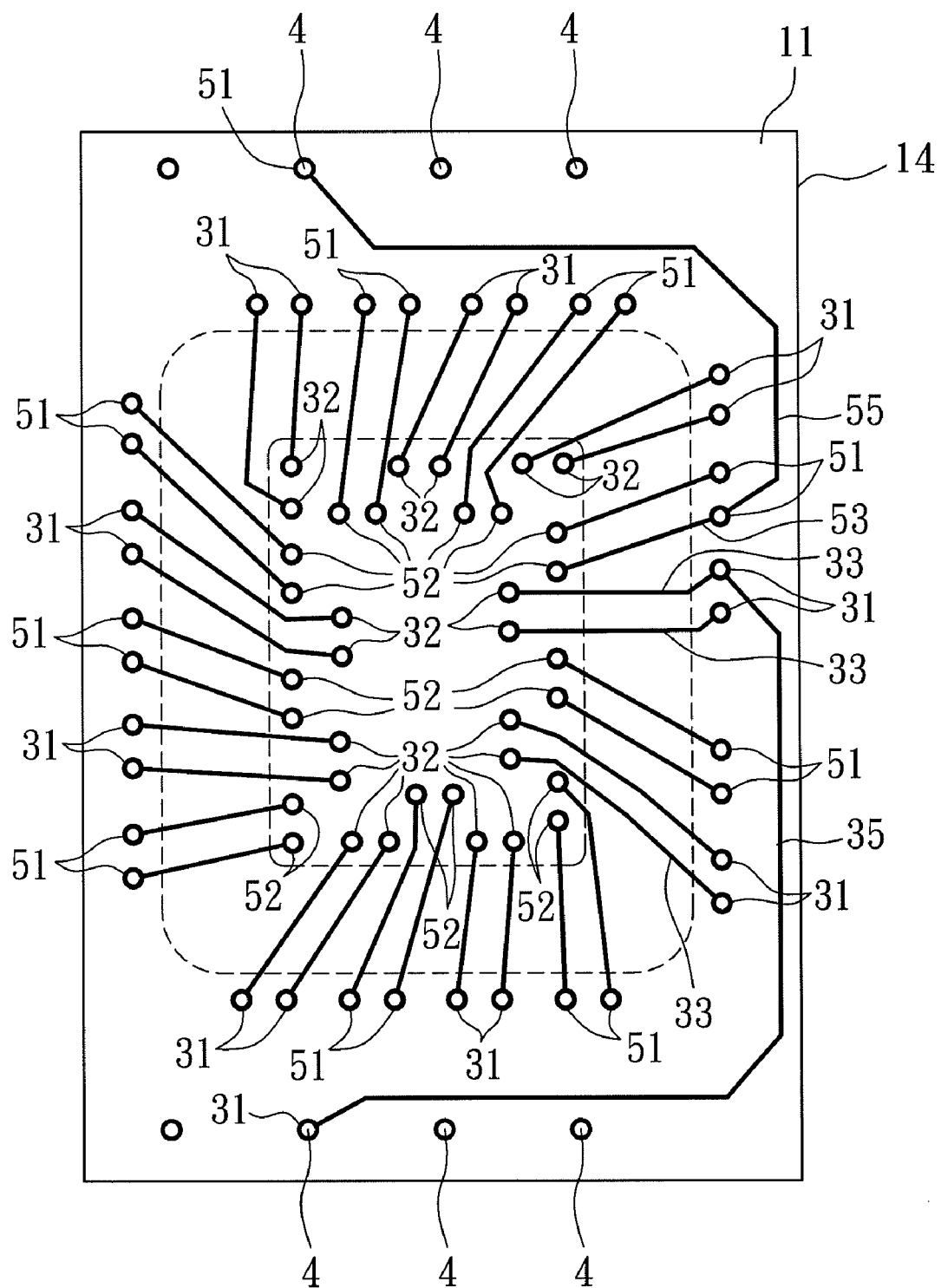
FIG. 14 is a top view showing a first trace-forming side of a basic substrate unit of the fifth preferred embodiment.
Figure 15:
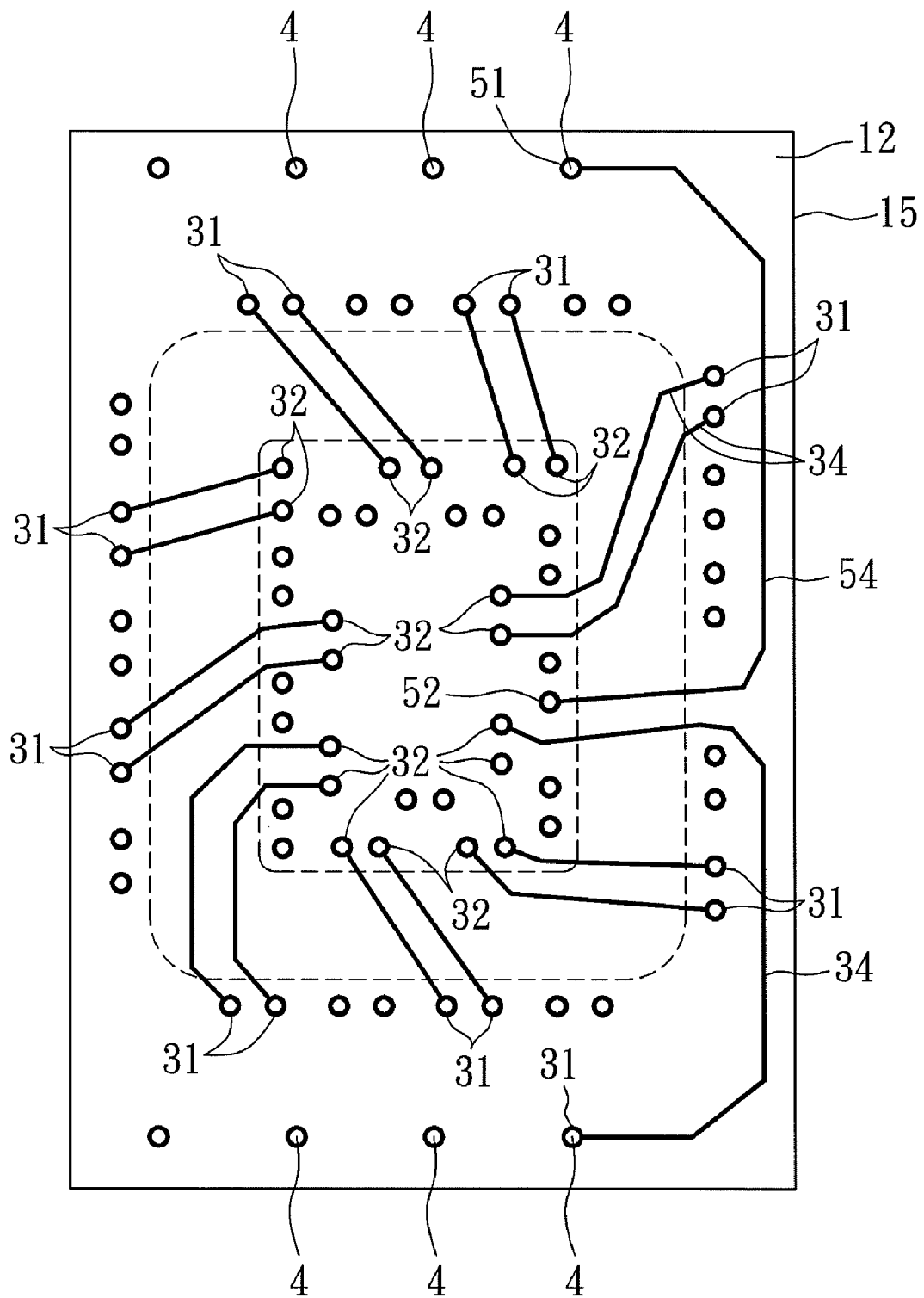
FIG. 15 is a bottom view showing a second trace-forming side of the basic substrate unit of the fifth preferred embodiment.
Figure 16:
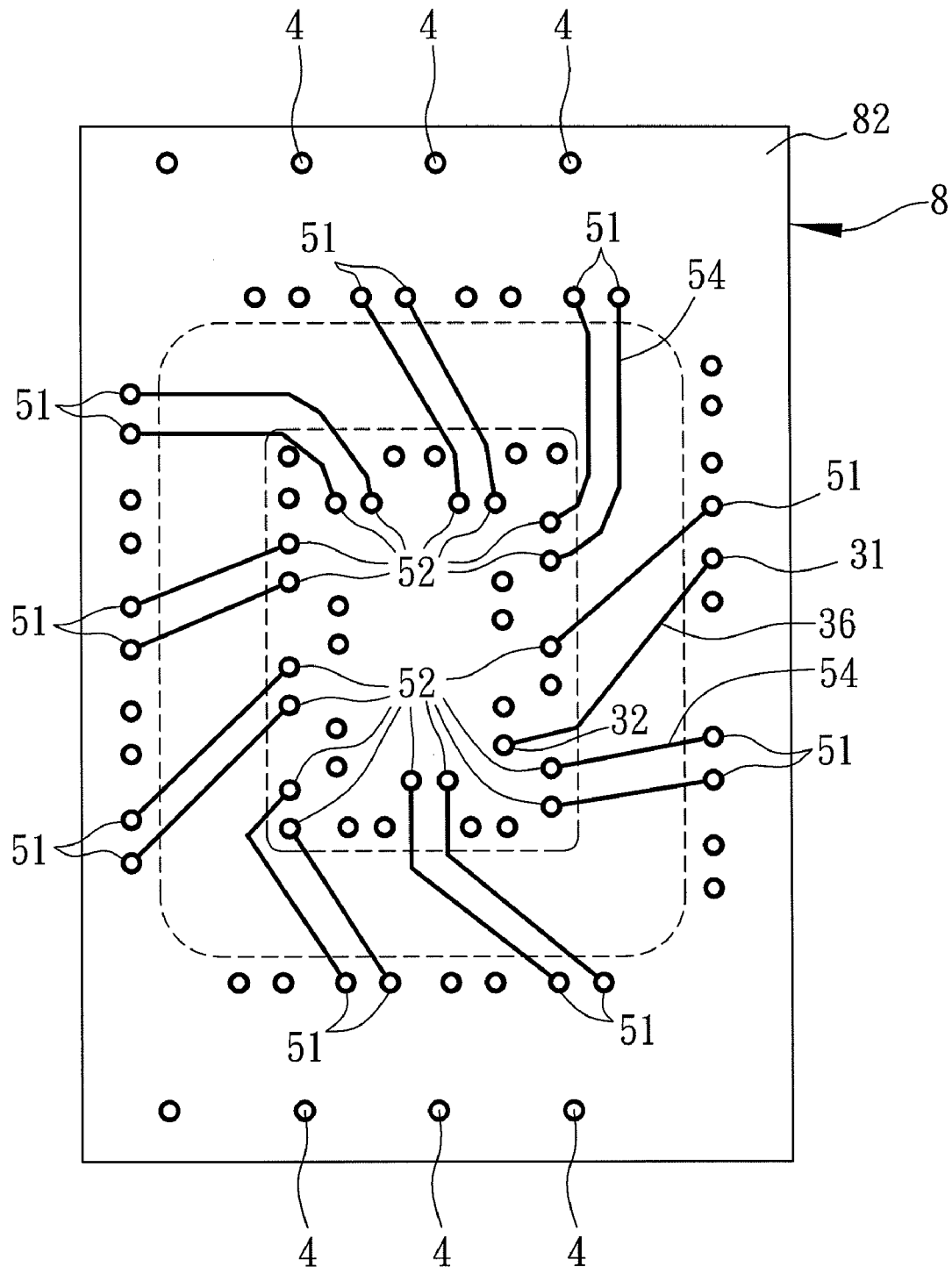
FIG. 16 is a bottom view showing an outer trace-forming side of a second outer substrate unit of the fifth preferred embodiment.

In this embodiment, the third electric current path is connected electrically to the first electric current path via additional conductive traces 95 shown in FIG. 8 and FIG. 9. Consequently, as shown in FIG. 12, the inductive module of the fourth preferred embodiment is embodied in a pulse transformer with center tapped primary and secondary windings and a common-mode choke.

It should be noted herein that, in this embodiment, only the first and second conductive vias 51, 52 of the second coil unit 5 and some of the first conductive vias 91 of the third coil unit 9 extend through each of the basic substrate unit 1 and the first and second outer substrate units 7, 8, while the first and second conductive vias 31, 32 of the first coil unit 3 and the other first conductive vias 91 and all of the second conductive vias 92 of the third coil unit 9 extend only through the basic substrate unit 1. Such a design provides more flexibility for a circuit designer to achieve different relationships between electric current paths by suitably configuring the first, second and third coil units 3, 5, 9.

The combination of the basic substrate unit 1 and the first and second outer substrate units 7, 8 of the fourth preferred embodiment is in the form of a multi-layer printed circuit board (PCB). The first and second conductive traces 33, 34, 53, 54, 93, 94 of the first, second and third coil units 3, 5, 9 are formed from copper foils respectively plated on the first and second trace-forming sides 11, 12 of the basic substrate unit 1 and the outer trace-forming sides 72, 82 of the first and second outer substrate units 7, 8.

Figure 17:
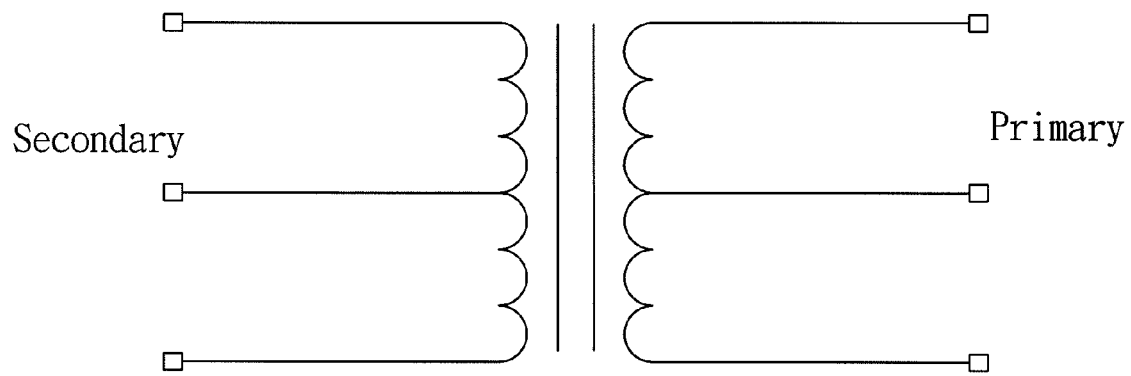
FIG. 17 is a schematic diagram, illustrating a pulse transformer implementation of the fifth preferred embodiment that is without a common-mode choke.

As shown in FIG. 17, the fifth preferred embodiment of an inductive module according to the present invention is embodied in a pulse transformer without a common-mode choke, in which only one core unit (i.e., the first core unit 1) and two coil units (i.e., the first and second coil units 3, 5) are included.

With reference to FIGS. 13 to 16, as with the fourth preferred embodiment, the fifth preferred embodiment also includes the first and second outer substrate units 7, 8 in addition to the basic substrate unit 1. The first conductive traces 53 of the second coil unit 5 are disposed on the first trace-forming side 11 of the basic substrate unit 1. The second conductive traces 54 of the second coil unit 5 are disposed on the outer trace-forming side 82 of the second outer substrate unit 8.

The first coil unit 3 further includes two third traces 35 respectively disposed on the first trace-forming side 11 of the basic substrate unit 1 and the outer trace-forming side 72 of the first outer substrate unit 7, and respectively interconnecting corresponding pairs of the first conductive vias 31, one of which is in electrical connection with one of the conductive contacts 4. Similarly, the second coil unit 5 further includes two third traces 55 respectively disposed on the first trace-forming side 11 of the basic substrate unit 1 and the outer trace-forming side 72 of the first outer substrate unit 7, and respectively interconnecting corresponding pairs of the first conductive vias 51, one of which is in electrical connection with one of the conductive contacts 4.

In addition, the first coil unit 3 further includes a fourth conductive trace 36 disposed on the outer trace-forming side 82 of the second outer substrate unit 8, and interconnecting a corresponding pair of the first and second conductive vias 31, 32 of the first coil unit 3.

Figure 18:
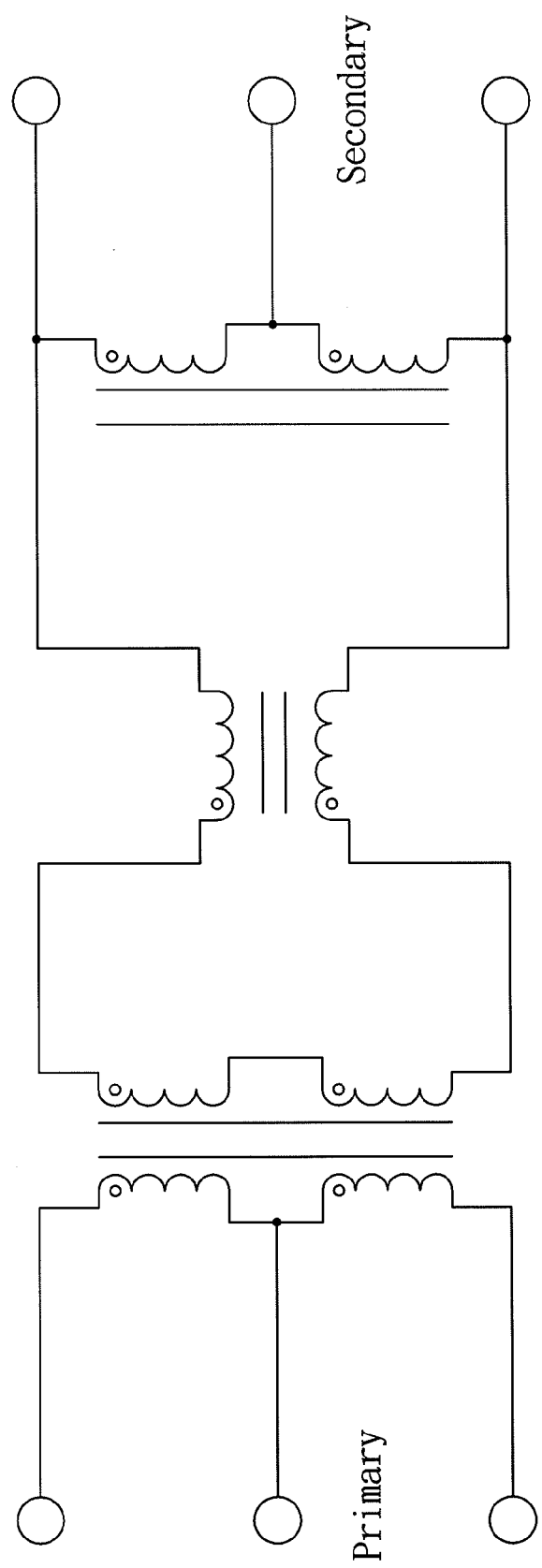
FIG. 18 is a schematic diagram of a pulse transformer implementation of the sixth preferred embodiment of an inductive module according to the present invention that has both a common-mode choke and an auto-transformer.

The sixth preferred embodiment of an inductive module according to the present invention is a variation of the fourth preferred embodiment, in which three core units are embedded in the basic substrate unit 1. With a suitable design of conductive vias and conductive traces, the sixth preferred embodiment can be used to implement a pulse transformer device that has both a common-mode choke and an auto-transformer as shown in FIG. 18.

Figure 19:
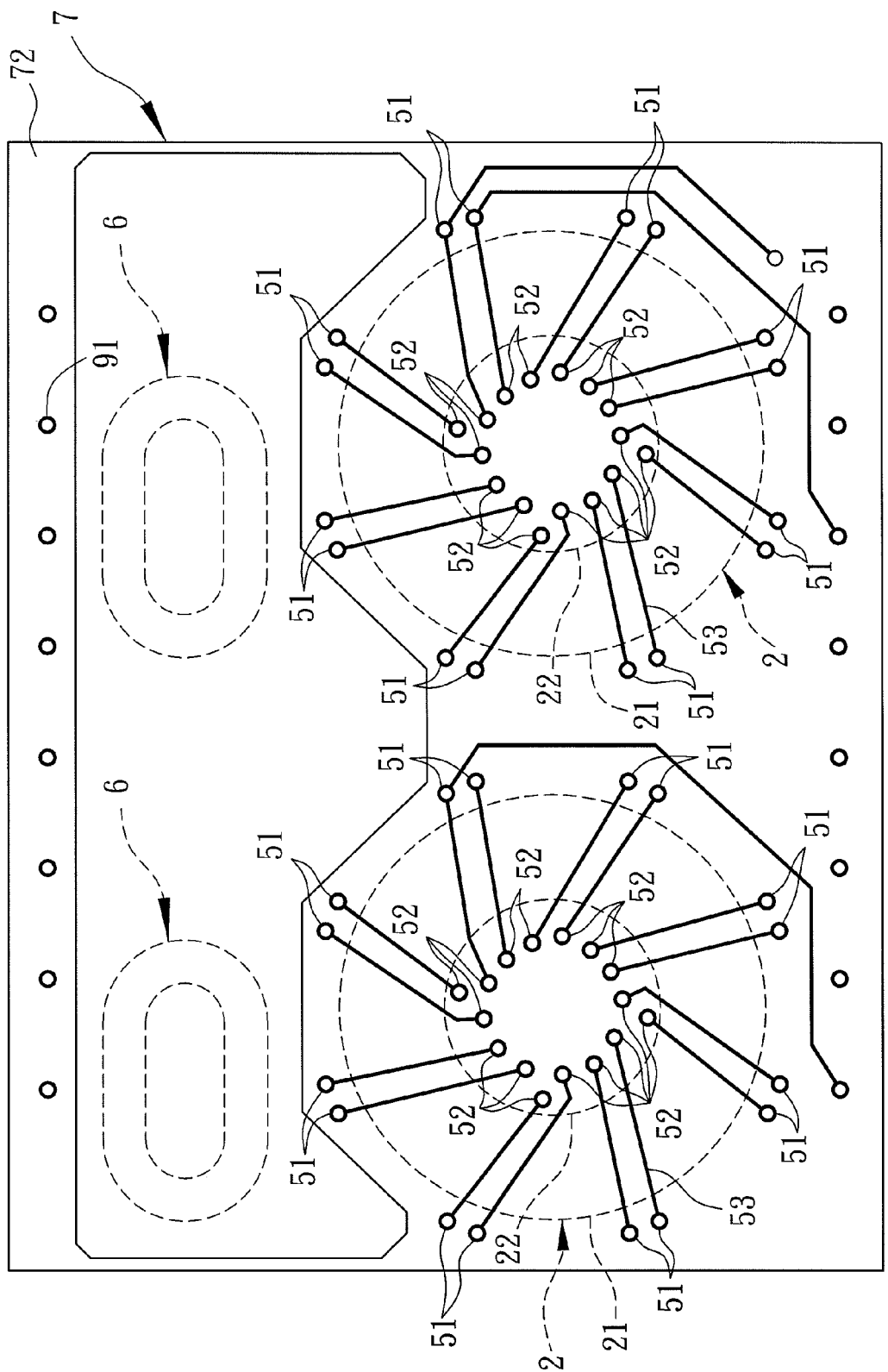
FIG. 19 is a top view of the seventh preferred embodiment of an inductive module according to the present invention.

As shown in FIG. 19, the seventh preferred embodiment of an inductive module according to the present invention incorporates two of the inductive modules of the fourth preferred embodiment, such that the seventh preferred embodiment includes two pulse transformers.

It should be appreciated by those skilled in the art that the embodiments provided hereinabove are merely exemplary implementations of the present invention. The principles of the present invention should be readily applied to achieve numerous other configurations and implementations of an inductive module.

It can be concluded from the above that the present invention achieves the following advantages:

1. Manual Labor is not Required for Making the Windings, Thereby Greatly Increasing Productivity.

Taking the first preferred embodiment as an example, as shown in FIG. 1 and FIG. 2, the inductive module according to the present invention can be manufactured in an automated process for a printed circuit board (PCB) where the first core unit 2 is embedded in the basic substrate unit 1 when the formation of the basic substrate unit 1 is completed, followed by using drilling and wiring techniques for multi-layer PCBs to form the first and second conductive vias 31, 32 and the first and second conductive traces 33, 34 of the first coil unit 1, the connections and layout of which being previously designed during a circuit wiring layout stage. By suitably connecting the first and second conductive vias 31, 32 and the first and second conductive traces 33, 34 to create an electric current path that winds around the first core unit 2, manual winding of enamel-covered wires in conventional inductive devices is no longer required. Consequently, productivity, accuracy, and costs are reduced.

2. High Yield Rate is Achieved.

Since automated manufacturing processes for printed circuit boards are well developed in the field, yield rate, durability and quality control of the inductive module according to the present invention can be made more superior than the conventional inductive devices.

3. Final Products are Compact and Lightweight.

Since the first and second conductive vias 31, 32 and the first and second conductive traces 33, 34 are used to replace the conventional windings that involve enamel-covered wires, using micro-circuit layout designs saves a lot of space and weight conventionally occupied by and attributed to the enamel-covered wires. In addition, since the first core unit 2 is embedded in the basic substrate unit 1, an external insulating support, such as a case or a bobbin, necessary for conventional inductive devices is no longer required. Consequently, the "lightweight and compact" trend in the electronics industry is met. It should be noted herein that the minimum product thickness achieved so far by the present invention is 1.6 mm, much smaller than the minimum thickness of 1.98 mm for the conventional inductive devices.

4. The Present Invention is a Self-Contained Module.

The final product of the inductive module according to the present invention is in the form of a printed circuit board. With the conductive contacts 4 disposed in electrical contact with the electric current path, the inductive module may be easily connected electrically to other external devices for incorporation. Moreover, two or more inductive devices (e.g., transformer, inductor) may be incorporated within one inductive module of the present invention, an example of which is shown in FIG. 19 with the seventh preferred embodiment.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An inductive module comprising:
    an electrically insulating basic substrate unit having opposite first and second trace-forming sides;
    a first core unit made from a ferromagnetic material, embedded in said basic substrate unit, and having a pair of opposite first and second vertical sides and a pair of first and second opposite horizontal sides, said first and second horizontal sides being substantially parallel to said first and second trace-forming sides and being respectively spaced apart from said first and second trace-forming sides; and
    a first coil unit including
        a plurality of first conductive vias formed in said basic substrate unit adjacent to said first vertical side of said first core unit, spaced apart from each other and from said first vertical side of said first core unit, and extending from said first trace-forming side to said second trace-forming side,
        a plurality of second conductive vias formed in said basic substrate unit adjacent to said second vertical side of said first core unit, spaced apart from each other and from said second vertical side of said first core unit, and extending from said first trace-forming side to said second trace-forming side,
        a plurality of first conductive traces, each of which is disposed on said first trace-forming side of said basic substrate unit and interconnects electrically a corresponding pair of said first and second conductive vias, and
        a plurality of second conductive traces, each of which is disposed on said second trace-forming side of said basic substrate unit and interconnects electrically a corresponding pair of said first and second conductive vias;
    wherein said first and second conductive traces and said first and second conductive vias of said first coil unit cooperate to form a first electric current path that substantially winds around said first core unit.

2. The inductive module as claimed in claim 1, further comprising a plurality of conductive contacts, each of which is disposed in electrical contact with a corresponding one of said first and second conductive vias.

3. The inductive module as claimed in claim 1, wherein said first core unit includes a substantially annular core.

4. The inductive module as claimed in claim 1, wherein said basic substrate unit is a printed circuit board, said first and second conductive traces of said first coil unit being formed from copper foils respectively plated on said first and second trace-forming sides of said basic substrate unit.

5. The inductive module as claimed in claim 1, wherein said basic substrate unit includes:
    a central layer that has opposite first and second surfaces, and that is formed with an open-ended core-receiving space having openings respectively disposed at said first and second surfaces, said first core unit being received in said core-receiving space such that said first and second horizontal sides of said first core unit are exposed respectively from said openings; and
    first and second layers that are disposed respectively on said first and second surfaces of said central layer for respectively covering said first and second horizontal sides of said first core unit, and that are respectively formed with said first and second trace-forming sides.

6. The inductive module as claimed in claim 5, wherein said central layer is made from epoxy, and said first and second layers are glass fiber-containing layers.

7. The inductive module as claimed in claim 1, further comprising a second coil unit identical in structure to said first coil unit, and spaced apart from said first coil unit, wherein said first and second conductive traces and said first and second conductive vias of said second coil unit cooperate to form a second electric current path that substantially winds around said first core unit and that is separate from the first electric current path.

8. The inductive module as claimed in claim 7, wherein said first core unit includes a substantially rectangular core that is formed with a gap.

9. The inductive module as claimed in claim 1, further comprising a second coil unit identical in structure to said first coil unit, and spaced apart from said first coil unit, wherein said first and second conductive traces and said first and second conductive vias of said second coil unit cooperate to form a second electric current path that substantially winds around said first core unit and that is intertwined without crossing the first electric current path.

10. The inductive module as claimed in claim 9, wherein said first core unit includes a substantially annular core.

11. The inductive module as claimed in claim 1, further comprising a second coil unit identical in structure to said first coil unit, and spaced apart from said first coil unit, said first and second conductive traces and said first and second conductive vias of said second coil unit cooperating to form a second electric current path that substantially winds around said first core unit and the first electric current path, and that is electrically insulated from the first electric current path.

12. The inductive module as claimed in claim 11, further comprising first and second outer substrate units, each of which has an inner side disposed in contact with a corresponding one of said first and second trace-forming sides of said basic substrate unit, and an outer trace-forming side opposite to said inner side;
   each of said first and second conductive vias of said second coil unit further extending through each of said first and second outer substrate units;
   said first conductive traces of said second coil unit being disposed on said outer trace-forming side of said first outer substrate unit, and said second conductive traces of said second coil unit being disposed on said outer trace-forming side of said second outer substrate unit.

13. The inductive module as claimed in claim 12, wherein said first core unit includes a substantially annular core, at least one of said second conductive vias of said second coil unit being disposed adjacent to one side of a corresponding one of said second conductive vias of said first coil unit opposite to said second vertical side of said first core unit.

14. The inductive module as claimed in claim 11, further comprising:
   a second core unit identical in structure to said first core unit, embedded in said basic substrate unit, and spaced apart from said first core unit; and
   a third coil unit including
   a plurality of first conductive vias formed in said basic substrate unit adjacent to said first vertical side of said second core unit, spaced apart from each other and from said first vertical side of said second core unit, and extending from said first trace-forming side to said second trace-forming side of said basic substrate unit,
   a plurality of second conductive vias formed in said basic substrate unit adjacent to said second vertical side of said second core unit, spaced apart from each other and from said second vertical side of said second core unit, and extending from said first trace-forming side to said second trace-forming side of said basic substrate unit,
   a plurality of first conductive traces, each of which is disposed on said first trace-forming side of said basic substrate unit and interconnects electrically a corresponding pair of said first and second conductive vias of said third coil unit, and
   a plurality of second conductive traces, each of which is disposed on said second trace-forming side of said basic substrate unit and interconnects electrically a corresponding pair of said first and second conductive vias of said third coil unit;
   wherein said first and second conductive traces and said first and second conductive vias of said third coil unit cooperate to form a third electric current path that substantially winds around said second core unit.

15. The inductive module as claimed in claim 14, wherein the third electric current path is connected electrically to the first electric current path.

16. The inductive module as claimed in claim 14, further comprising a plurality of conductive contacts, each of which is disposed in electrical contact with a corresponding one of said first and second conductive vias of a corresponding one of said first, second and third coil units.

17. The inductive module as claimed in claim 14, further comprising first and second outer substrate units, each of which has an inner side disposed in contact with a corresponding one of said first and second trace-forming sides of said basic substrate unit, and an outer trace-forming side opposite to said inner side;
   each of said first and second conductive vias of said second coil unit further extending through each of said first and second outer substrate units;
   said first conductive traces of said second coil unit being disposed on said outer trace-forming side of said first outer substrate unit, and said second conductive traces of said second coil unit being disposed on said outer trace-forming side of said second outer substrate unit.

18. The inductive module as claimed in claim 17, wherein each of said first and second core units includes a substantially annular core.

19. The inductive module as claimed in claim 17, further comprising a plurality of conductive contacts, each of which is disposed in electrical contact with a corresponding one of said conductive vias of a corresponding one of said first and third coil units.

20. The inductive module as claimed in claim 17, wherein the combination of said basic substrate unit and said first and second outer substrate units is in the form of a multi-layer printed circuit board, said first and second conductive traces of said first, second and third coil units being formed from copper foils respectively plated on said first and second trace-forming sides of said basic substrate unit and said outer trace-forming sides of said first and second outer substrate units.

21. The inductive module as claimed in claim 7, further comprising an outer substrate unit having an inner side disposed in contact with a corresponding one of said first and second trace-forming sides of said basic substrate unit, and an outer trace-forming side opposite to said inner side;
   each of said first and second conductive vias of said second coil unit further extending through said outer substrate unit;
   said first conductive traces of said second coil unit being disposed on said first trace-forming side of said basic substrate unit, and said second conductive traces of said second coil unit being disposed on said outer trace-forming side of said outer substrate unit.

22. The inductive module as claimed in claim 21, wherein the first and second electric current paths are centered tapped.

* * * * *